United States Patent
Ek et al.

(10) Patent No.: US 8,639,206 B1
(45) Date of Patent: Jan. 28, 2014

(54) METHOD AND APPARATUS FOR QUADRATURE MIXER CIRCUITS

(71) Applicant: Telefonaktiebolaget LM Ericsson (publ), Stockholm (SE)

(72) Inventors: Staffan Ek, Malmö (SE); Lars Sundström, Södra Sandby (SE)

(73) Assignee: Telefonaktiebolaget L M Ericsson (Publ), Stockholm ( * ) Notice: Subject to any disclaimer, the term of this patent is extended or adjusted under 35 U.S.C. 154(b) by 0 days.

(21) Appl. No.: 13/645,974

(22) Filed: Oct. 5, 2012

(51) Int. Cl.
*H04B 1/26* (2006.01)

(52) U.S. Cl.
USPC ............... 455/326; 455/114.1; 455/189.1; 455/209; 455/293; 375/235; 375/295; 329/306

(58) Field of Classification Search
USPC .......... 455/326, 114.1, 189.1, 209, 293; 329/306; 375/235, 295
See application file for complete search history.

(56) References Cited

U.S. PATENT DOCUMENTS

| | | | |
|---|---|---|---|
| 6,724,246 B2 * | 4/2004 | Oberschmidt et al. | 329/306 |
| 6,822,519 B1 | 11/2004 | Moreland et al. | |
| 7,098,715 B2 | 8/2006 | Severson | |
| 7,130,604 B1 | 10/2006 | Wong et al. | |
| 7,218,850 B2 * | 5/2007 | Stuart | 398/26 |
| 7,224,235 B2 | 5/2007 | De Ranter et al. | |
| 7,480,343 B2 * | 1/2009 | Eikenbroek et al. | 375/295 |
| 7,738,851 B2 | 6/2010 | Cooley et al. | |
| 2009/0190698 A1 | 7/2009 | Schwarzmueller | |
| 2010/0119022 A1 | 5/2010 | He et al. | |
| 2011/0241748 A1 | 10/2011 | Leong et al. | |

FOREIGN PATENT DOCUMENTS

| | | | |
|---|---|---|---|
| EP | 1916764 | A2 | 4/2008 |
| EP | 2179504 | B1 | 2/2011 |
| EP | 2328269 | A2 | 6/2011 |
| WO | 0126214 | A2 | 4/2001 |
| WO | 2008135954 | A2 | 11/2008 |
| WO | 2008139390 | A1 | 11/2008 |
| WO | 2009057051 | A2 | 5/2009 |
| WO | 2010000603 | A1 | 1/2010 |
| WO | 2011070013 | A2 | 6/2011 |

OTHER PUBLICATIONS

Weldon et al, "A 1.75-GHz Highly Integrated Narrow-Band CMOS Transmitter With Harmonic-Rejection Mixers," IEEE Journal of Solid-State Circuits, vol. 36, No. 12, Dec. 2001, pp. 2003-2015.

(Continued)

*Primary Examiner* — Sanh Phu
(74) *Attorney, Agent, or Firm* — Murphy, Bilak & Homiller, PLLC

(57) ABSTRACT

The teachings presented herein allow the same sequence of local oscillator waveform sample values to be used for driving two harmonic rejection mixers for which quadrature operation is desired, irrespective of whether the oversampling rate of the sequence is divisible by four or only divisible by two. This ability is obtained by controlling whether the quadrature mixer clocks coincidentally with the in-phase mixer, or clocks a half clock cycle out of phase relative to the in-phase mixer. Several advantages attend the contemplated circuit arrangement and method of operation. Example advantages include the improved matching that comes from operating both mixers with the identical waveform sample values, and the improved flexibility in optimizing the harmonic rejection and/or interference-related operation of the mixers over a broader range of frequencies of interest, which flows from having a larger set of usable OSRs.

16 Claims, 8 Drawing Sheets

(56) References Cited

OTHER PUBLICATIONS

Ru et al., "Software-Defined Radio Receiver Architecture Robust to Out-of-Band Interference," IEEE International Solid-State Circuits Conference, ISSCC, Feb. 8-12, 2009, San Francisco, pp. 232-233.

Sundström, Lars et al., "A Method and Apparatus for Mixer-Based Harmonic Rejection," Pending U.S. Appl. No. 13/450,537, filed Apr. 19, 2012.

Intersil, "400MHz Quadrature IF Modulator/Demodulator," Data Sheet HFA3724, Nov. 1999, pp. 1-24.

Sundström, Lars et al., "Mixer Arrangement, Radio Circuit and Communication Apparatus," Pending EP Patent Application Serial No. 12164771.3 filed Apr. 19, 2012.

Sundström, Lars et al. "Complex IF harmonic rejection mixer for non-contiguous dual carrier reception in 65 nm CMOS," IEEE European Solid-State Circuits Conference, Sep. 2012, pp. 1-4.

Sundström, Lars et al. "Harmonic rejection mixer at ADC input for complex IF dual carrier receiver architecture," IEEE Radio Frequency Integrated Circuits Symposium, Jun. 2012, pp. 265-268.

* cited by examiner

METHOD AND APPARATUS FOR QUADRATURE MIXER CIRCUITS

TECHNICAL FIELD

The present invention generally relates to communication signal processing, and particularly relates to the use of quadrature mixers in such processing.

BACKGROUND

Mixers multiply signals in the time domain. Because time domain multiplication corresponds to convolution in the frequency domain, mixing two sinusoids produces output sinusoids at the sum and difference of the respective frequencies of the input sinusoids. Mixers thus find widespread use in communication signal transmitters and receivers, where they are used to shift signals from one frequency range to another. For example, mixers downconvert received signals from the carrier frequency used in transmission to intermediate and/or baseband frequencies suitable for processing. Conversely, on the transmit side, mixers upconvert baseband signals to carrier frequencies used in signal transmission.

In a simple example, an input signal is shifted to a desired output frequency by mixing it with a local oscillator or "LO" signal. The LO signal has an LO frequency chosen so that the sum or difference of the LO frequency and the input signal frequency corresponds to the desired output frequency, and output filtering eliminates the unwanted sum or difference frequency. As with many aspects of signal processing, practical implementations of mixers result in the generation of output signal components at undesired frequencies.

For example, the input signal frequency and/or the LO frequency may bleed through the mixer, although single-balanced and double-balanced configurations may be used to eliminate or greatly reduce these problems. A greater challenge arises in the generation of unwanted harmonics associated with the use of "switched" mixers, wherein the local oscillator waveform is a squarewave or other stepped waveform, rather than an analog sinusoid. The use of switched circuitry for mixing allows for greater digitization of the mixing circuitry and its corresponding control, but results in more harmonic content at the mixer output unless mitigations are adopted.

Harmonic rejection mixers adopt various approaches to reducing the harmonic content of their output signals. One type of harmonic rejection mixer having particularly advantageous characteristics operates as a time-discrete and time-variant transconductance. Rather than using an explicit LO waveform to mix with an input signal, this type of mixer applies the input signal to a variable conductance circuit and switches that circuit through a sinusoidal sequence of conductance values at a frequency corresponding to the desired LO frequency. For reasons of spectral purity and low complexity, this particular type of harmonic rejection mixer operates with an integer number of samples per LO period. The number of samples used to represent one period of the LO waveform is referred to as the oversampling rate or OSR.

The harmonic rejection performance of such mixers depends on a complex set of variables, but ultimately can be understood as depending on the fidelity or accuracy at which the variable conductance can be controlled to behave as a sinusoidally varying conductance. In turn, the accuracy of control depends on the resolution of control for the variable conductance. More plainly, each sample value in the sequence should map to a conductance value corresponding to a discrete sample point on the ideal LO waveform.

Different OSRs yield different harmonic rejection performance for given input and output frequencies of interest. Because communication devices are increasingly required to operate in multiple carrier frequency bands, and because the simultaneous use of two or more carrier frequencies—"carrier aggregation"—is an increasingly exploited technology in current and developing wireless standards, the particular OSR that a harmonic rejection mixer should operate with will change in dependence on the particular frequencies of interest at any given time.

In a general approach, the harmonic rejection mixer will use a preprogrammed sequence of sample values representing the LO waveform. In a quadrature configuration, two such mixers will operate ninety degrees out of phase with respect to each other. Quadrature mixing is used to process in-phase and quadrature components of communication signals. Such operation applies to mixer operation in a variety of contexts, including image rejection and various up- and down-conversion applications, with the common characteristic being operation on a clocked basis, using discrete sequences of sample values.

Achieving quadrature operation is straightforward when the OSR of such sequences is divisible by four, because the required ninety-degree phase shift between the in-phase and quadrature mixer elements corresponds to an integer number of sequence positions in the LO waveform sequence. Thus, the same sequence can be used by the in-phase and quadrature mixer elements, with the quadrature mixer element simply offsetting the sequence by the number of sequence positions corresponding to the desired quadrature shift.

Such operation is not possible when the OSR does not divide by four, and the quadrature phase shift requires the use of a different sequence of sample values. That is, one known approach to handling a range of OSRs, including OSRs not divisible by four, involves applying different sequences to the in-phase and quadrature mixer elements. The sequence applied to the quadrature mixing element comprises sample values that are computed to reflect a ninety degree phase shift relative to the sample values of the sequence applied to the in-phase mixer element.

This approach thus requires having two sets of sequences, including a pair of in-phase and quadrature sequences for each OSR of interest. Moreover, although each sequence may represent LO waveforms with low harmonic content, the magnitude and phase of the fundamental LO tones generally become different. This translates to a severely limited image rejection ratio for the overall mixer, because of unavoidable non-linearity associated with quantized control of the variable conductance. In other words, using different sample values between the two mixers effectively means that the LO waveform used by the quadrature mixer element is not identical to the LO waveform used by the in-phase mixer element.

SUMMARY

The teachings presented herein allow the same sequence of local oscillator waveform sample values to be used for driving two mixers for which quadrature operation is desired, irrespective of whether the oversampling rate of the sequence is divisible by four or only divisible by two. This ability is obtained by controlling whether the quadrature mixer clocks coincidentally with the in-phase mixer, or clocks a half clock cycle out of phase relative to the in-phase mixer. Several advantages attend the contemplated circuit arrangement and method of operation. Example advantages include the improved matching that comes from operating both mixers with the identical waveform sample values, and the improved flexibility in optimizing the harmonic rejection and/or interference-related operation of the mixers over a broader range of frequencies of interest, which flows from having a larger set of usable OSRs.

An example mixer apparatus includes first and second mixer circuits and a control circuit. The first mixer circuit is configured to generate a first output signal from an input signal, based on repeatedly clocking through a sequence of sample values representing one period of a sinusoidal local oscillator waveform and having a sequence length corresponding to an oversampling rate ("OSR") of the sequence. Similarly, the second mixer circuit is configured to generate a second output signal from a second input signal, based on repeatedly clocking through a shifted sequence, which is the same sequence used by the first mixer, but shifted by an integer number of sequence positions.

In a first case, the sequence length, which is a function of the OSR of the sequence, divides by four, and the second mixer shifts the sequence by one quarter. For this first case, the control circuit is configured to control the second mixer to clock coincidentally with the first mixer circuit. In other words, the desired quadrature phase shift coincides with an integer shift of the sequence, and the quadrature phase relationship is maintained between the first and second mixer circuits by the control circuit configuring the two mixer circuits to clock together, such that they clock through the sequence together, changing from one sample value to the next at the same instants in time.

In a second case, however, the sequence length divides by two but not by four. For example, the sequence may be selected from a defined set of sequences corresponding to different OSRs, all of which divide by two and some of which divide by four. For the second case, there is no integer shift in sequence positions that will yield the desired quadrature phase relationship. For this second case, the second mixer circuit is configured to shift the sequence to get as close as possible to a one-quarter shift, and the control circuit is configured to control the second mixer circuit to clock a half clock cycle out of phase with respect to the first mixer circuit. Assuming a fifty percent duty cycle for the clock, the half clock phase difference in clocking between the two mixer circuits adds or subtracts the remaining amount of phase shift needed between the two mixer circuits for quadrature operation.

The control circuit is thus configured to maintain a quadrature phase relationship between the first and second mixer circuits independent of whether the first or second case applies by controlling the second mixer circuit to clock coincident with the first mixer circuit if the first case applies, and to clock a half clock cycle out of phase with the first mixer circuit if the second case applies. Depending upon the particulars of the clock signal, such operation may be achieved by configuring the second mixer circuit to clock on opposite clock edges relative to the first mixer circuit—e.g., if the first mixer circuit clocks through the sequence on rising clock edges, the second mixer circuit also clocks on rising clock edges if the first case applies, and on falling clock edges if the second case applies.

In one embodiment, the mixer apparatus includes a selection control input and the control circuit is configured to select the sequence from a defined set of sequences in response to a selection control signal applied to the selection control input. This arrangement is advantageous in an arrangement contemplated herein where the mixer apparatus comprises part of a transmitter circuit or a receiver circuit in a wireless communication apparatus that includes an oversampling control circuit configured to control the selection of the oversampling rate used by the mixer apparatus, which may be used as a harmonic rejection mixer apparatus for example.

In a further example, a wireless communication apparatus includes a transmitter and/or receiver that includes a configuration of the mixer apparatus contemplated herein, and it controls selection of the OSR based on at least one of: a frequency relationship between transmit and receive frequencies of the wireless communication apparatus, a frequency relationship between one or more interferer signals and a receive frequency of the wireless communication apparatus, and a frequency relationship between a frequency of the first and second input signals and a clocking frequency of the first and second mixer circuits. Here, it should be understood that the clocking frequency varies with the OSR.

Of course, the present invention is not limited to the above features and advantages. Indeed, those skilled in the art will recognize additional features and advantages upon reading the following detailed description, and upon viewing the accompanying drawings.

DETAILED DESCRIPTION

Figure 1:
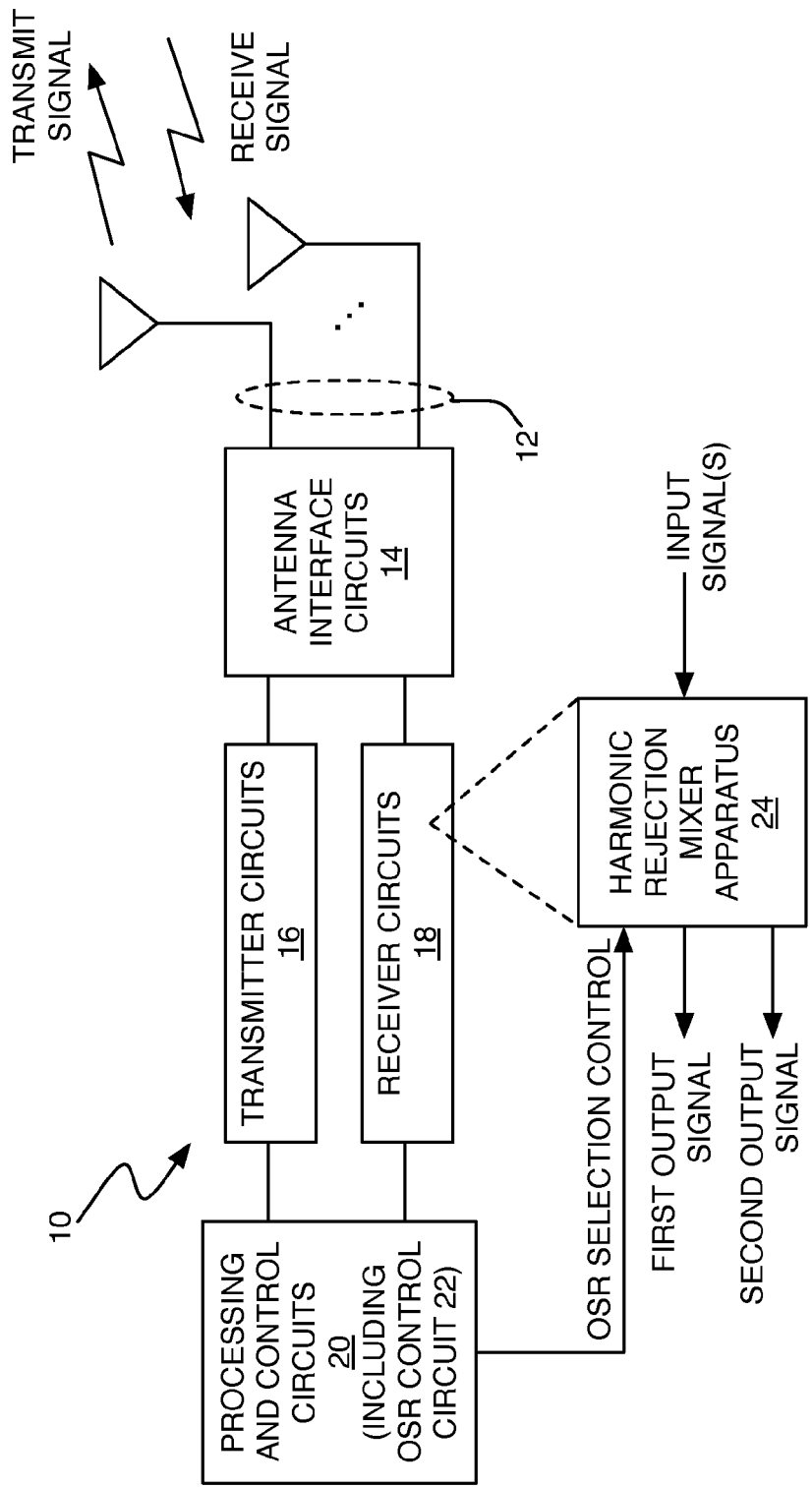
FIG. 1 is a block diagram of one embodiment of a wireless communication apparatus that includes a mixer apparatus according to the teachings herein, e.g., a harmonic rejection mixer apparatus.

FIG. 1 illustrates a wireless communication apparatus 10, which may be an item of user equipment or "UE" according to Third Generation Partnership Project ("3GPP") nomenclature. More broadly, the wireless communication apparatus 10 comprises essentially any type of wireless communication device or system, such as a radio network node, a smartphone, a network adaptor or modem, etc.

Although subject to much variation, the diagram depicts example circuitry and other elements, including one or more transmit/receive antennas 12, antenna interface circuits 14, transmitter and receiver circuits 16 and 18, and associated processing and control circuits 20, including an oversampling rate ("OSR") control circuit 22. The OSR control circuit 22 provides advantageous control of the OSR used by a mixer apparatus 24, which by way of example is included in the receiver circuits 18 of the wireless communication apparatus 10. The mixer apparatus 24, which is hereafter simply referred to as the "mixer apparatus 24" could just as easily have been implemented in the transmitter circuits 16—indeed, the wireless communication apparatus 10 may include multiple instances of the mixer apparatus 24, possibly in differing configurations, for use in both transmit and receive signal processing chains.

Figure 2:
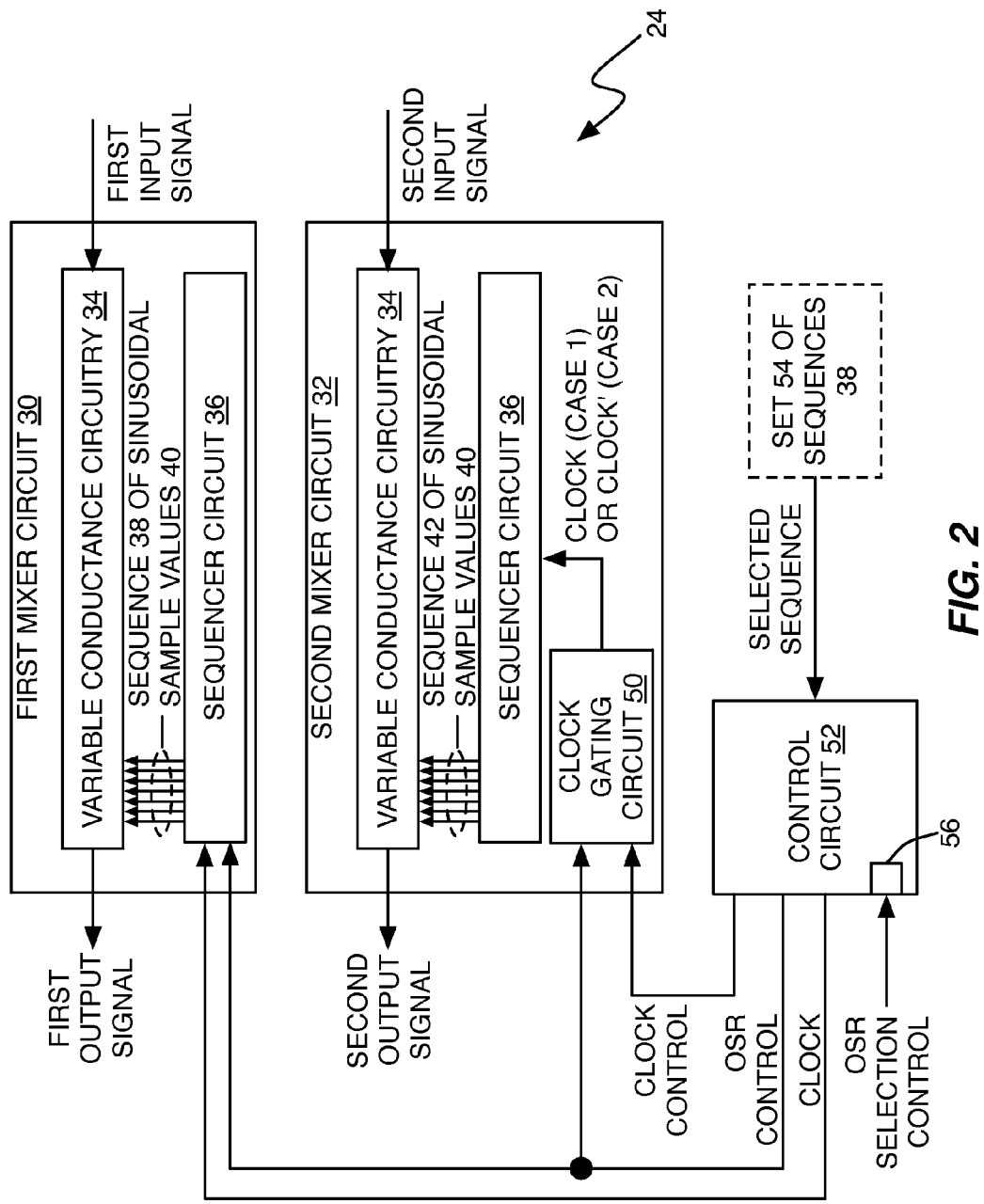
FIG. 2 is a block diagram of an embodiment of a mixer apparatus, such as introduced in FIG. 1.

FIG. 2 depicts an example arrangement for the mixer apparatus 24, which is configured as a quadrature harmonic rejection mixer arrangement, in which a second mixer circuit 32 is intended to operate in quadrature with respect to a first mixer circuit 30. In this regard, the first mixer circuit 30 is configured to generate a first output signal from an input signal, based on repeatedly clocking through a sequence 38 of sample values 40 representing one period of a sinusoidal local oscillator waveform and having a sequence length corresponding to an oversampling rate of the sequence 38.

Similarly, the second mixer circuit 32 is configured to generate a second output signal from a second input signal, based on repeatedly clocking through a shifted sequence 42, which is the sequence 38, as shifted by an integer number of sequence positions that is equal to one quarter of the sequence length for a first case where the sequence length divides by four, or is as close to one quarter of the sequence length as possible for a second case where the sequence length divides by two but not by four.

It should be appreciated that an exact one-quarter shift in the sequence 38 when the sequence 38 is divisible by four corresponds to a quadrature phase shift. Correspondingly, it should be appreciated that when the sequence 38 is divisible by two but not by four, the desired quadrature phase shift does not correspond to an integer number of sequence positions, but rather will always fall "between" two adjacent sequence positions.

However, the mixer apparatus 24 includes a control circuit 52 that is configured to maintain a quadrature phase relationship between the first and second mixer circuits 30, 32 independent of whether the first or second case applies. The control circuit 52 provides this independence by controlling the second mixer circuit 32 to clock coincident with the first mixer circuit 30 if the first case applies, and to clock a half clock cycle out of phase with the first mixer circuit 30 if the second case applies.

Figure 3:
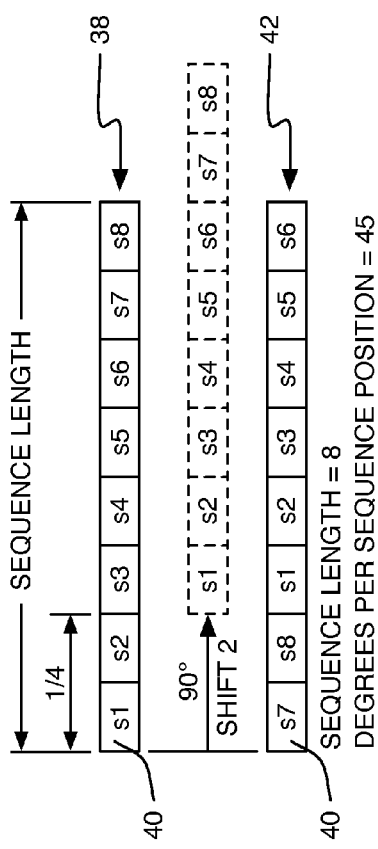
FIG. 3 is a diagram of an example sequence for use with a mixer apparatus, where the sequence is divisible by four and thus can be shifted by an integer number of sequence positions to obtain a quadrature shift.
Figure 4A:
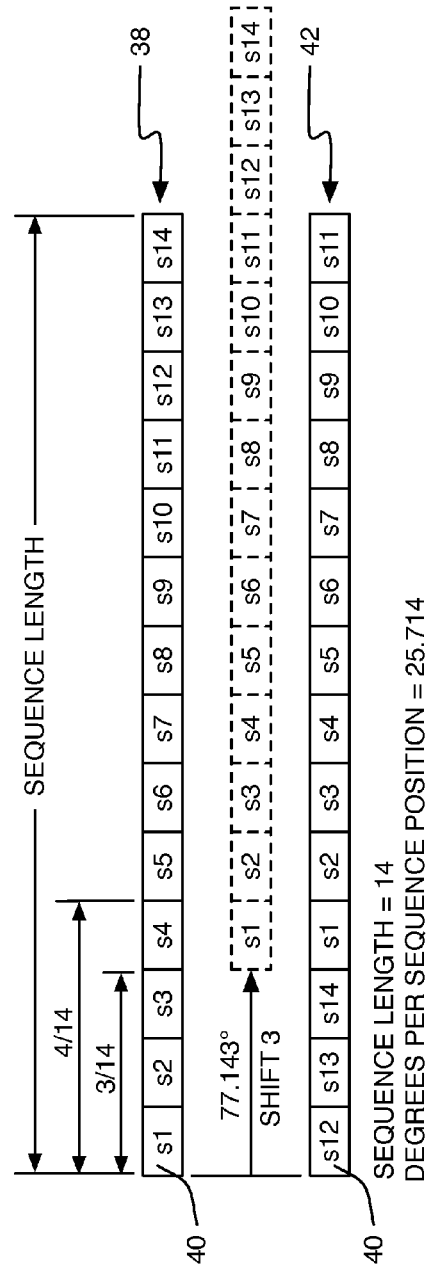
FIGS. 4A and 4B are diagrams of an example sequence for use with a mixer apparatus, where the sequence is divisible by two but not by four and hence cannot be shifted by an integer number of sequence positions to obtain a quadrature shift.
Figure 4B:
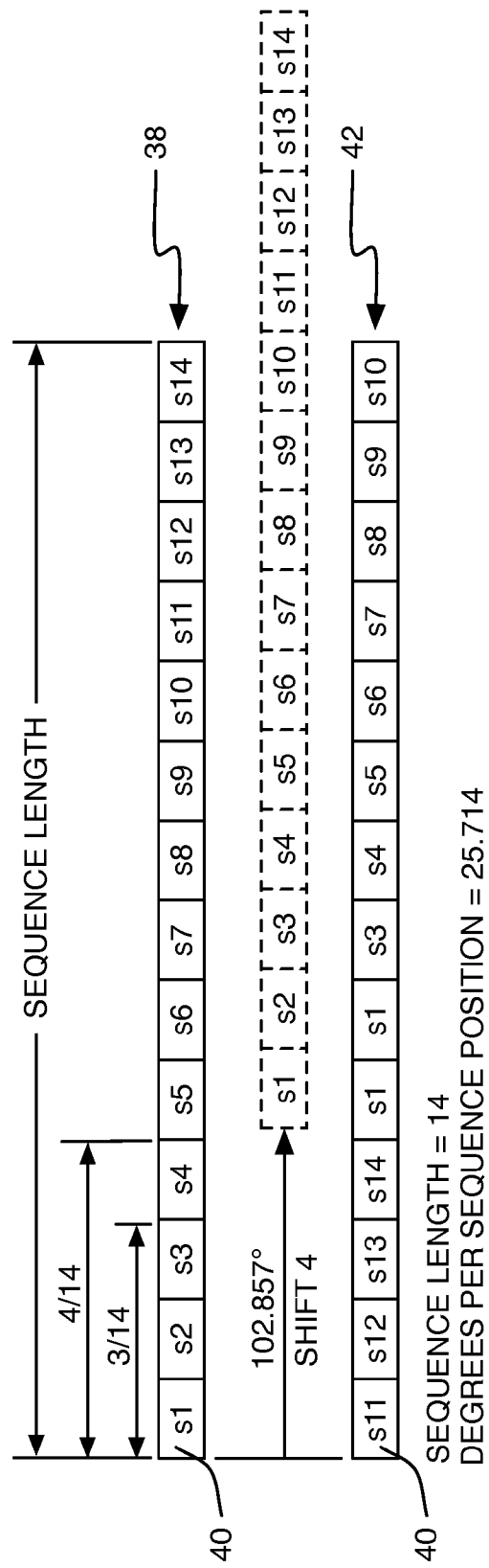

Further details in FIG. 2, particularly when considered in view of FIGS. 3, 4A and 4B, will aid in understanding the contemplated clocking control. As a first point, consider the example details shown in FIG. 2 for the internal workings of the mixer circuits 30 and 32. Both mixer circuits 30 and 32 include variable conductance circuitry 34 driven by the sample values 40 in the sequence 38 or 42, which is the sequence 38 in shifted form. The sample values 40 are sequentially applied to the variable conductance circuitry 34 by a sequencer circuit 36, in response to a clock signal from the control circuit 52.

Each sample value 40 causes the variable conductance circuitry 34 to take on a different discrete conductance value, meaning that the conductance changes sequentially in time in response to clocking through the sequence of sample values applied to it. In this respect, each sample value can be understood as being a "control word" that selects one of the available conductance values provided by the variable conductance circuitry 34. Each of the two mixer circuits 30 and 32 thus vary their input-to-output conductance sequentially over time, in response to sequentially clocking through a sequence of control words applied to their variable conductance circuitry 34.

Because the sequence 38 in one example comprises a set of sample values 40 representing one period of sinusoidal local oscillator ("LO") waveform, repeatedly clocking through the sequence 38 causes the variable conductance circuitry 34 to exhibit a sinusoidally varying conductance. Such variation effectively mixes the first input signal with the LO waveform represented by the sequence 38. The same operation applies to the mixer 32, except that it operates on a second input signal using a shifted version of the same LO waveform. Both mixer circuits 30 and 32 clock at a clock rate equal to the desired LO frequency times the OSR—i.e., f_CLK=f_LO× OSR.

When the second mixer circuit 32 is controlled to clock coincidentally with the first mixer circuit 30, their sequencer circuits 36 both change the sample values 40 applied to their respective variable conductance circuits 34 at the same instants in time. In contrast, when the second mixer circuit 32 is configured to clock a half clock cycle out of phase relative to the first mixer circuit 30, it clocks to the next sample value 40 in the shifted sequence 42 either one half clock cycle earlier or later than the first mixer circuit 30 clocks to the next sample value 40 in the sequence 38, assuming a fifty percent duty cycle for the clock signal.

Depending upon the implementation details at hand, the first and second input signals may be the same, or they may be different. However, the control circuit 52 maintains a quadrature relationship between the corresponding mixer circuits 30 and 32 and their respective output signals, based on the clock control taught herein. Along those lines, those skilled in the art will appreciate that a clock circuit may be implemented apart from the control circuit 52, for sharing by the two sequencers 36 and the particulars of FIG. 2 merely provide a basis for outlining the principal aspects of the contemplated clocking control.

The half clock cycle phase relationship is achieved in one embodiment by configuring the second mixer circuit 32 to clock on the same or opposite clock edges as compared to the first mixer circuit 30. Such control is dynamic, e.g., in dependence on whether the OSR of the selected sequence 38 is or is not divisible by four. Controlling which clock edges are used to trigger the second mixer circuit 32 is configured in view of the type of clock signal involved—e.g., single-ended or differential, as will be understood by those skilled in the art.

Moreover, the advantageous clocking control taught herein applies to mixer arrangements that are not based on the variable conductance circuitry 34 shown by way of example in FIG. 2. In other words, the clock control teachings presented herein apply to any mixer arrangement where two clocked mixer circuits use the same sequence of sample values to control their mixing operations, and where it is desired to maintain a quadrature phase relationship between the two mixer circuits based on shifting the sequence between them.

Thus, in one aspect, the teachings herein disclose a method of controlling two mixer circuits 30 and 32, whose internal circuitry may differ from the example illustration, but where the first mixer circuit 30 achieves its mixing operation by repeatedly clocking through a sequence 38 of sample values 40, and the second mixer circuit 32 achieves its mixing operation by repeatedly clocking through a shifted sequence 42 containing the same sample values 40.

The shifted sequence 42 is the sequence 38 that is shifted by one quarter of the sequence length, if possible, or that is shifted by an amount that is as close as possible to the one-quarter mark. The method includes recognizing which case applies and controlling the second mixer circuit 32 to clock coincidentally with the first mixer circuit 30 or to clock a half clock cycle output of phase with respect to the first mixer circuit 30, in dependence on which case applies.

FIGS. 3, 4A and 4B better illustrate the logic behind such control. FIG. 3 presents an example sequence 38 having a sequence length of eight (8). Because the sequence 38 represents one period or 360 degrees of a sinusoidal LO waveform, it will be appreciated that shifting from one sequence position to the next represents a 45 degree step, i.e., 360 degrees/8 positions=45 degrees/position. Thus, the shifted version 42 of the sequence 38 exhibits an exact quadrature shift with respect to the sequence 38 when it is shifted by two sequence positions. In other words, the quadrature phase shift coincides with an integer shift of two sequence positions.

Thus, if the mixer circuit 32 clocks through the shifted sequence 42 at the same time instants as the mixer circuit 30 clocks through the sequence 38, its LO waveform will be based on the identical sample values 40 as used by the mixer circuit 30, but its LO waveform will be shifted precisely ninety degrees relative to the LO waveform of the first mixer circuit 30.

Note that the sequence length depends on the OSR. Shannon's sampling theorem dictates a minimum sampling rate of twice the frequency of interest and, allowing for the in-phase and quadrature operation, a sequence length of eight corresponds to an OSR of eight. FIGS. 4A and 4B illustrate the added complexity that comes from using an OSR that is not divisible by four, using an example OSR of fourteen (14). Because 360 degrees divided by 14 sequence positions results in a shift of 25.714 degrees per sequence position, there is no integer number of sequence positions that can be shifted to obtain the desired quadrature shift between the shifted sequence 42 and the sequence 38.

As shown in FIG. 4A, a shift of three sequence positions results in a relative phase shift of 77.143 degrees between the sequence 38 and the shifted version of the sequence 38, as represented by the sequence 42. Effectively, then, a shift of three sequence positions is one-half of a sequence position short of the desired ninety-degree shift. On the other hand, as shown in FIG. 4B, a shift of four sequence positions yields a shift of 102.857 degrees, which is one-half of a sequence position more than the desired ninety-degree shift.

The second mixer circuit 32 thus operates with a shift of three or four sequence positions, because either one of those shifts represents a shift in an integer number of sequence positions that is as close as possible to one quarter of the sequence length. Correspondingly, if the mixer apparatus 24 is configured to use a shift of three sequence positions for forming the sequence 42, then the second mixer circuit 32 will clock one half clock cycle later in time than the first mixer circuit 30. If the mixer apparatus 24 uses a shift of four sequence positions for forming the sequence 42, then the second mixer circuit 32 will clock one half clock cycle earlier in time than the first mixer circuit 30. Of course, the chosen shift may be preconfigured or otherwise fixed for any given sequence length and OSR, so that the clocking is always either one half clock cycle earlier or later.

In some embodiments, the mixer apparatus 24 is configured to apply a single-ended clock signal to the first and second mixer circuits 30, 32. The clock signal nominally has a fifty-percent duty cycle and a clock frequency equal to a desired frequency of the sinusoidal LO waveform multiplied by the OSR. The control circuit 52 is configured to control whether the second mixer circuit 32 clocks coincident with the first mixer circuit 30 or clocks a half clock cycle out of phase with the first mixer circuit 30 by controlling whether the second mixer circuit 32 clocks on the same or opposite edges as the first mixer circuit 30.

With a single-ended clock signal, configuring the second mixer circuit 32 to clock on the same clock edges as the first mixer circuit 30 results in coincidental clocking. Conversely, configuring the second mixer circuit 32 to clock on the opposite clock edges as compared to the first mixer circuit 30 results in a half clock cycle phase shift between the two mixer circuits 30 and 32. Such control applies to the differential clock signal case, but the anti-phase relationship of the differential clock signals is accommodated in the control logic of the control circuit 52.

Thus, in some embodiments, the control circuit 52 is configured to assert a clocking control signal in dependence on whether the first or second case applies. Correspondingly, the second mixer circuit 32 includes a clock gating circuit 50 that dynamically determines whether the second mixer circuit 32 clocks on the rising or falling clock edges, in dependence on assertion of the clocking control signal.

Such control complements an arrangement of the mixer apparatus 24, wherein the control circuit 52 is configured to select the sequence 38 from a defined set 54 of sequences 38. Different ones of the sequences 38 correspond to different OSRs. Of course, there may be multiple sequences 38 in the set 54 that correspond to the same OSR but comprise different sets of sample values 40 that offer better mixer performance under certain conditions.

However, it will be understood that the mixer apparatus 24 in some embodiments operates with a set 54 of sequences 38 corresponding to different OSRs, all of which are divisible by two and some of which are further divisible by four. Such a set provides a greater or more varied range of choices for OSR, thus allowing more accurate or appropriate choices for the selected OSR, while preserving the desirability of using the same sequence 38 of sample values for both mixers 30 and 32.

In an example of the above arrangement, the mixer apparatus 24 includes a selection control input 56 and wherein the control circuit 52 is configured to select the sequence 38 from the defined set 54 in response to a selection control signal applied to the selection control input 56. Such an arrangement allows other circuitry to control the sequence selection (and hence, the OSR selection) made by the mixer apparatus 24. For example, the mixer apparatus 24 comprises part of a transmitter circuit 16 or a receiver circuit 18 in the wireless communication apparatus 10 shown in FIG. 1.

The wireless communication apparatus includes an oversampling control circuit 22 configured to control the selection of the OSR used by the mixer apparatus 24 based on at least one of: a frequency relationship between transmit and receive frequencies of the wireless communication apparatus 10; a frequency relationship between one or more interferer signals and a receive frequency of the wireless communication apparatus 10; and a frequency relationship between a frequency of the first and second input signals and a clocking frequency of the first and second mixer circuits 30, 32, which clocking frequency varies with the oversampling rate.

In a more general case, OSR selection(s) may be based on more than one receive frequency, where each receive frequency corresponds to one carrier with a certain bandwidth. For example, with carrier aggregation, a receiver receives multiple carriers simultaneously. The actual bandwidth of the received signals also is a parameter of interest considered in OSR selection in one or more embodiments.

Figure 5:
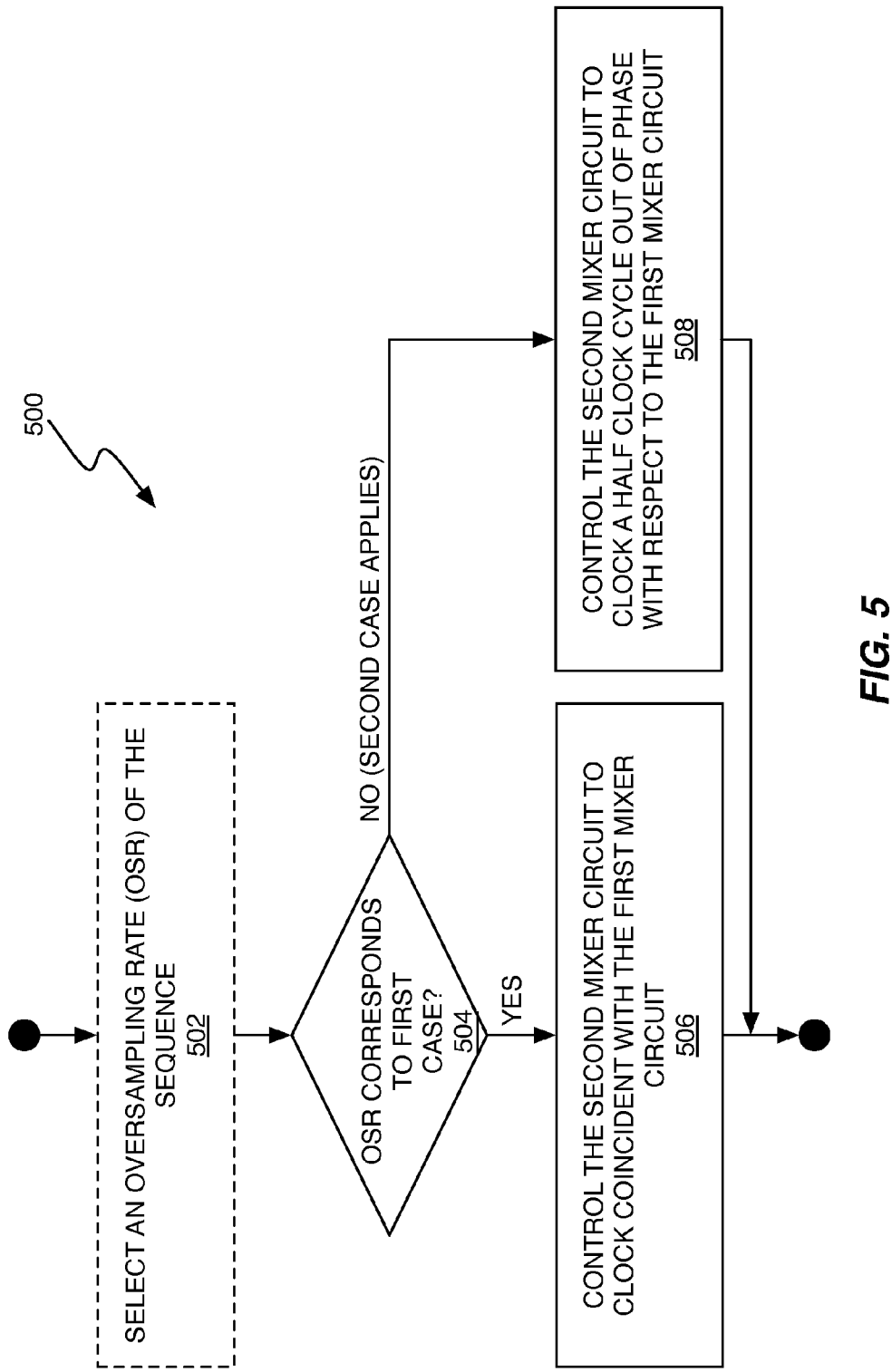
FIG. 5 is a logic flow diagram of one embodiment of a method of controlling a mixer apparatus as taught herein, for quadrature operation independent of the sequence OSR.

The method 500 illustrated in FIG. 5 provides an example of such operation, presented from the perspective of the mixer apparatus 24. Such processing is performed by the mixer apparatus 24, based on the configuration of fixed and/or programmable circuitry, as used to implement the mixer apparatus 24.

The method 500 assumes that an OSR has been selected (Block 502). The mechanism for selecting a particular sequence 38 from the defined set 54 of sequences 38 resides in the mixer apparatus 24, and the intelligence for making the selection also may reside in the mixer apparatus 24, or external circuitry may make the selection and simply signal to the mixer apparatus 24 which sequence 38 it should select.

In any case, with the particular sequence 38 selected, the control circuit 52 of the mixer apparatus 24 determines whether the OSR corresponds to the first case, where the length of the selected sequence 38 is divisible by four, or to the second case, where the length of the selected sequence 38 is divisible by two but not by four. In the first case (YES from Block 504), processing continues with controlling the second mixer circuit 32 to clock coincidentally with the first mixer circuit 30 (Block 506). Such clocking may be the default case, so that "control" in this regard means not asserting one or more clocking control signals—i.e., simply allowing the second mixer circuit 32 to operate in a default clocking mode.

If the second case applies (NO from Block 504), processing continues controlling the second mixer circuit 32 to clock a half clock cycle out of phase relative to the first mixer circuit 30 (Block 508). If coincidentally clocking is the default mode, then controlling the second mixer circuit 32 to clock a half clock cycle out of phase relative to the first mixer circuit 30 comprises, in one example, the control circuit 52 asserting a clock control or clock gating signal that is applied to a clock gating circuit 50 implemented in or in association with the second mixer circuit 32. The clock gating circuit 50 controls whether the second mixer circuit 32 clocks on rising or falling clock edges of the clock signal, in dependence on whether the clock gating signal from the control circuit 52 is or is not asserted.

In further embodiments, a wireless communication apparatus 10 includes one or more instances of the mixer apparatus in each of its transmitter and receiver circuits 16 and 18, e.g., for upconversion/modulation in association with signal transmission, and for downconversion/de-modulation in association with signal reception. Still further, the mixer apparatus 24 may comprise multiple pairs of first and second mixer circuits 30 and 32, e.g., for use in processing multiple signals, such as in a carrier aggregation case, where the wireless communication apparatus 10 is configured to transmit and/or receive on multiple carrier frequencies.

Figure 6:
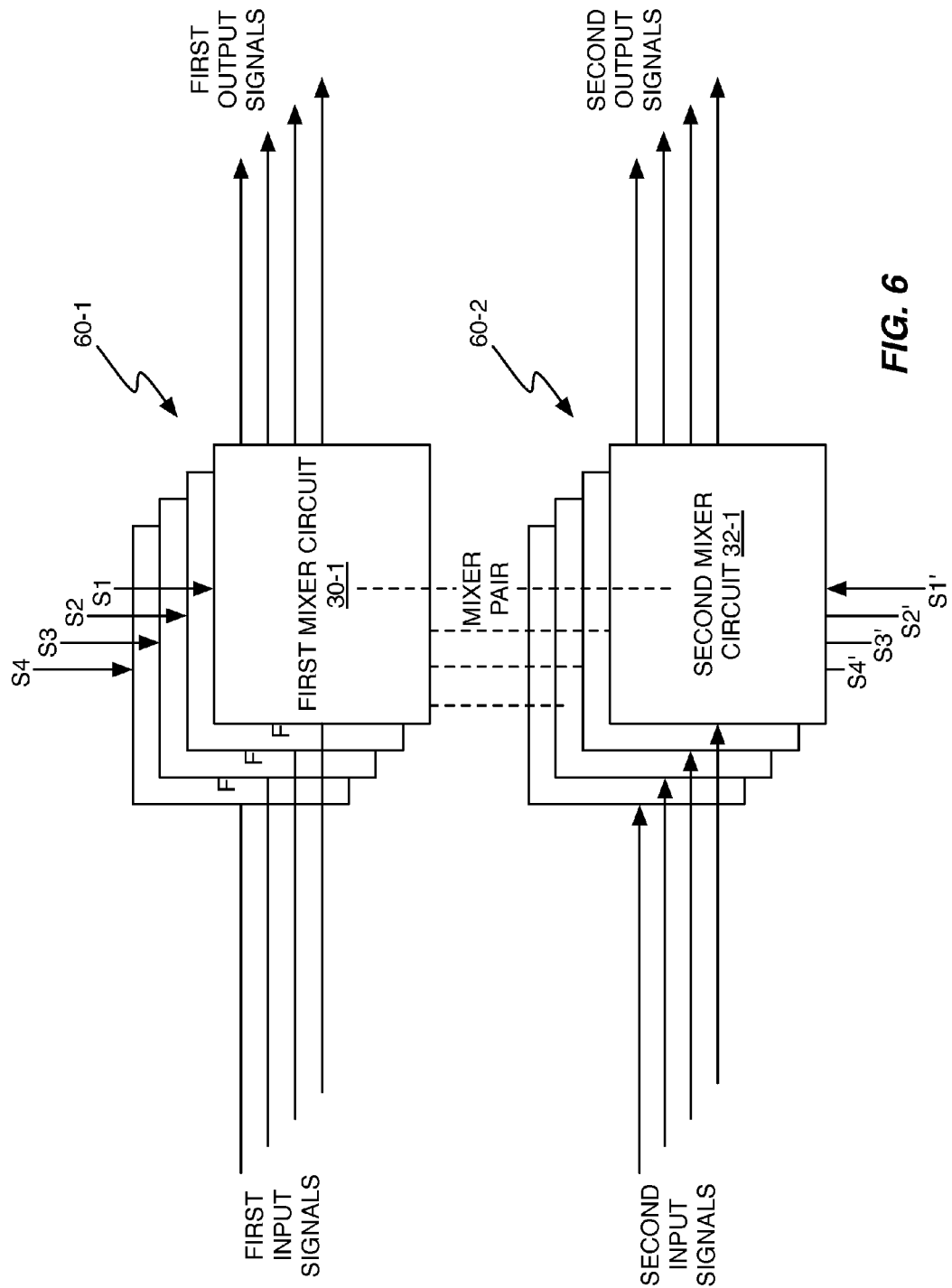
FIG. 6 is a block diagram of another embodiment of the mixer apparatus, wherein the mixer apparatus includes groups of mixer circuits.

FIG. 6 illustrates an example configuration of the mixer apparatus 24, wherein the first and second mixer circuits 30, 32 are among respective groups 60-1, 60-2 of first and second mixer circuits 30, 32 arranged as respective pairs of first and second mixer circuits, e.g., 30-1, 32-1. Here, the control circuit 52 is configured to control the second mixer circuit 32 in each pair to clock coincident with or a half clock cycle out of phase with the respective first mixer circuit 30 in the pair, in dependence on the oversampling rate of the sequence 38 used by the pair. In other words, different pairs of the mixer circuits 30 and 32 may operate with different sequences 38, corresponding to different OSRs. This is illustrated in the figure by illustrating different sequences 38 as S1, S2, and so on, and illustrating the corresponding shifted versions of those sequences 38 as S1', S2', and so on.

An example sequence 38 of sample values 40 may be generated according to the following expression $$s_{LO,I} = \cos(2\pi N/OSR + \phi_I),$$

where "I" denotes use of the sequence 38 as the in-phase sequence. Correspondingly, the shifted sequence 42 is represented as $$s_{LO,Q} = \sin(2\pi N/OSR + \phi_Q)$$

for N=[0, 1, . . . , OSR-1].

From these expressions, with an OSR of eight—sequence length equals eight—and with $\phi_I = \phi_Q = 0$, the sample values 40 in the sequence 38 approximately become $$s_{LO,I} = [1\ 0.707\ 0\ -0.707\ -1\ -0.707\ 0\ 0.707],$$

and the corresponding shifted sequence 42 is $$s_{LO,Q} = [0\ 0.707\ 1\ 0.707\ 0\ -0.707\ -1\ -0.707].$$

Here it is readily seen that the sample values 40 are the same except for the expected quadrature shift, corresponding to two sequence positions, for both $s_{LO,I}$ and $s_{LO,Q}$. This scenario thus represents an example of the first case, where the OSR is divisible by four and $s_{LO,Q}(N) = \sin(2\pi N/OSR) = \cos(2\pi(N/OSR+1/4)) = \cos(2\pi(N+OSR/4)/OSR)$. Thus, in such cases, the second mixer circuit 32 is configured to clock coincidentally with the first mixer circuit 30.

In an example of the second case, where the OSR equals ten, there is no integer number of sequence positions that can be shifted to obtain the quadrature relationship and, absent the teachings herein, the two mixer circuits 30 and 32 would have to be operated with different sequences of samples values, e.g., with $$s_{LO,I} = [1.000\ 0.809\ 0.309\ -0.309\ -0.809\ -1.000\\ -0.809\ -0.309\ 0.309\ 0.809], \text{ and}$$

$$s_{LO,Q} = [0.000\ 0.588\ 0.951\ 0.951\ 0.588\ 0.000\ -0.588\\ -0.951\ -0.951\ -0.588].$$

Here it is readily seen that sequence of samples are NOT the same for both $s_{LO,I}$ and $s_{LO,Q}$. However, by configuring the second mixer circuit 32 to clock a half cycle out of phase with respect to the first mixer circuit 30, the sequence 42 can be $$[0.309\ 0.809\ 1.000\ 0.809\ 0.309\ -0.309\ -0.809\ -1.000\\ -0.809\ -0.309],$$

for a shift of two sequence positions, which equals 72 degrees and with the half clock cycle phase difference adding the remaining 18 degrees (36 degrees/2=18) to obtain the 90 degree phase shift. Alternatively, the shifted sequence 42 can be $$[-0.309\ 0.309\ 0.809\ 1.000\ 0.809\ 0.309\ -0.309\ -0.809\\ -1.000\ -0.809],$$

for a shift of three sequence positions, which equals 108 degrees and with the half clock cycle phase difference subtracting the excess 18 degrees, to obtain the 90 degree phase shift.

The ability to use the same sample values 40 between the two mixer circuits 30 and 32 as taught herein is particularly advantageous in a double conversion receiver, where any strong interfering signals, such as an "own" transmit signal, appear at the mixer alias frequencies and thus will be converted to co-channel interference. Furthermore, aliases at high frequencies may couple back to the associated RF circuitry, thereby potentially leading to sensitivity degradation. By making more OSR values available—i.e., a set larger than if the divide-by-four constraint applied—the mixer apparatus 24 provides a larger degree of freedom in positioning the alias frequencies, as well as the clock frequency harmonics in frequency. Thus, the mixer apparatus 24 taught herein makes it much easier to select the "best" OSR for a wide range of frequency considerations.

Notably, the mixer apparatus 24 may be configured as a quadrature up-conversion or down-conversion mixer, a complex up-conversion or down-conversion mixer, or an image rejection up-conversion or down-conversion mixer. In general, the mixer apparatus 24 will have at least one input signal and at least one output signal. In addition to these, it may generate or receive a clock signal, and may receive an OSR control signal, which controls its selection of which sequence 38 is used from a defined set 54 of sequences 38. Equivalently, the supporting circuitry in the wireless communication apparatus 10 that includes the mixer apparatus 24 could provide the sequence 38, such different sequences 38 would be provided in different frequency scenarios.

Figure 7:
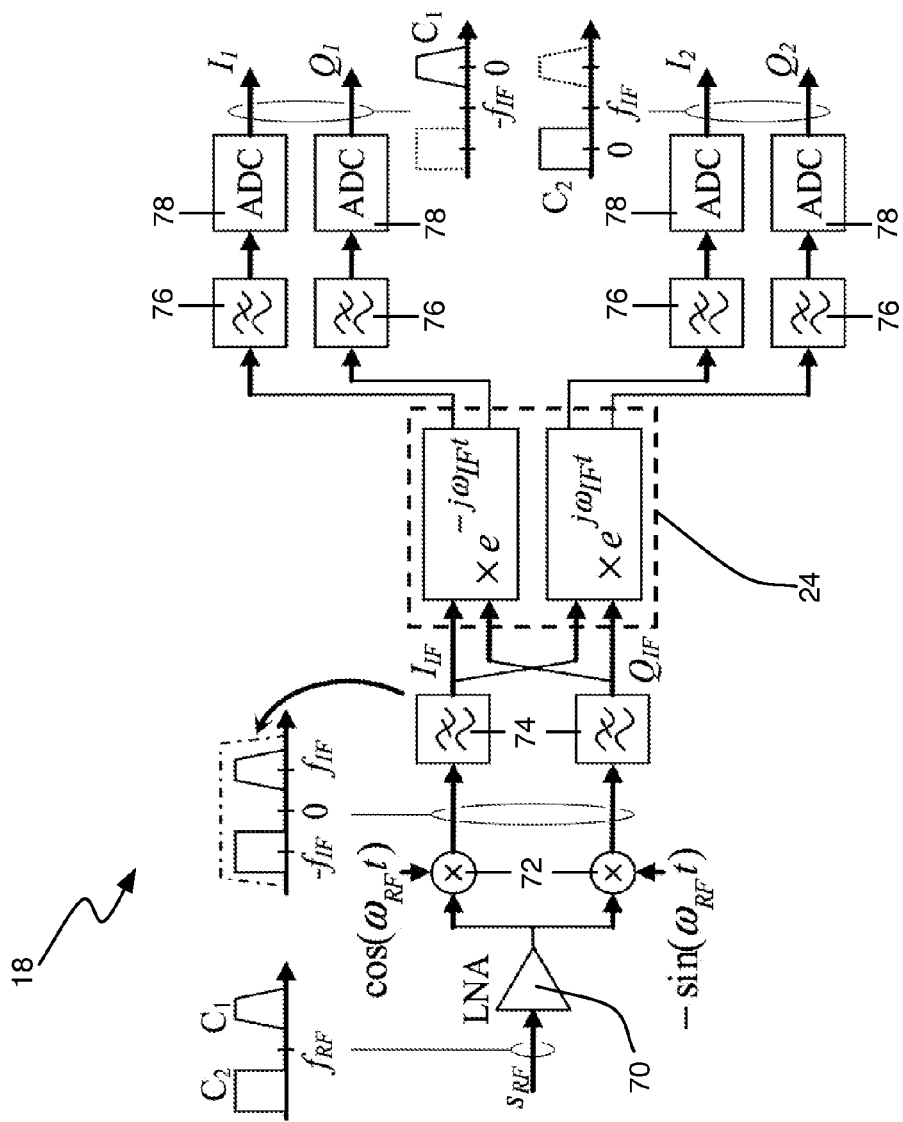
FIG. 7 is a block diagram of one embodiment of a dual-carrier RF receiver, which includes a pair of mixer apparatuses that provide harmonic rejection.

FIG. 7 illustrates an example where the increased frequency flexibility of the mixer apparatus 24 complements the use of carrier aggregation, in the context of a dual-carrier embodiment of the receiver 18 introduced in FIG. 1. Here, two carriers, C1 and C2, are received and processed simultaneously by the receiver 18 using an embodiment of the contemplated mixer apparatus 24.

In more detail, one sees a low noise amplifier ("LNA") 70 receiving an incoming signal $s_{RF}$ spanning a frequency range that includes the C1 and C2 carrier frequencies. Mixers 72 generate in-phase and quadrature components at an intermediate frequency, $f_{IF}$. The mixer apparatus 24 receives as its input signals the output signals $I_{IF}$ and $Q_{IF}$ from the filters 74. The mixer apparatus 24 generates corresponding output signals—$I_1$ and $Q_1$ as in-phase and quadrature signals for the carrier C1, and $I_2$ and $Q_2$ as in-phase and quadrature signals for the carrier C2. These output signals are filtered using filters 76 and then digitized for further processing via the analog-to-digital ("ADC") converters 78.

Figure 8:
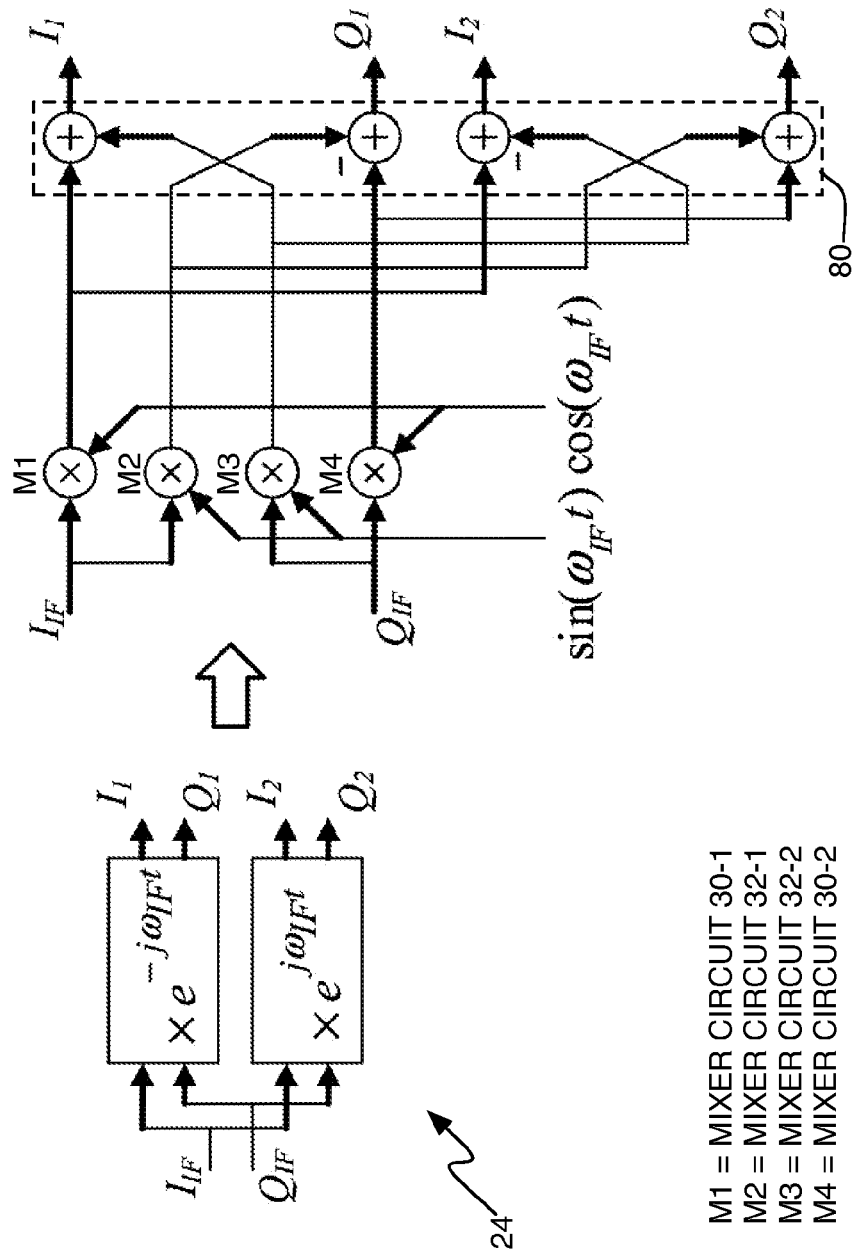
FIG. 8 is a block diagram providing example details for the mixer apparatus introduced in FIG. 7.

FIG. 8 depicts example details for the mixer apparatus 24, for advantageous operation in the context of the dual-carrier receiver embodiment of FIG. 7. FIG. 8 illustrates that the mixer apparatus 24 comprises a composite block of four harmonic rejection mixer circuits labeled for clarity in the diagram as "M1", "M2", "M3" and "M4". The M1-M4 harmonic rejection circuits are, for example, instances of the earlier-described mixer circuits 30 and 32.

The M1 and M4 mixers are operated as in-phase LO mixers, driven by $\cos(\omega_{IF}t)$, whereas the M2 and M3 mixers are operated as quadrature-phase LO mixers, driven by $\sin(\omega_{IF}t)$. Thus, the M1 and M4 mixers operate as instances of the earlier-described mixer circuit 30, e.g., M1 as a mixer circuit 30-1 and M4 as a mixer circuit 30-2, and the M2 and M3 mixers operate as instances of the earlier-described mixer circuit 32, e.g., M2 as a mixer circuit 32-1 in quadrature phase relationship to the mixer circuit 30-1 represented by M1, and M3 as a mixer circuit 32-2 in quadrature phase relationship to the mixer circuit 30-2 represented by M4.

Further, in this particular example arrangement, M1 and M2 have the same input signal; namely, the I component. Likewise, M3 and M4 have the same input signal; namely, the Q component. Correspondingly, the output signals from the M1-M4 mixers are combined in the combining circuits 80, as shown, to separate the C1 and C2 carriers from each other. That is, the illustrated arrangement advantageously produces $I_1$ and $Q_1$ corresponding to the C1 carrier, and $I_2$ and $Q_2$ corresponding to the C2 carrier.

Notably, modifications and other embodiments of the disclosed invention(s) will come to mind to one skilled in the art having the benefit of the teachings presented in the foregoing descriptions and the associated drawings. Therefore, it is to be understood that the invention(s) is/are not to be limited to the specific embodiments disclosed and that modifications and other embodiments are intended to be included within the scope of this disclosure. Although specific terms may be employed herein, they are used in a generic and descriptive sense only and not for purposes of limitation.

What is claimed is:

1. A mixer apparatus comprising:
    a first mixer circuit configured to generate a first output signal from an input signal, based on repeatedly clocking through a sequence of sample values representing one period of a sinusoidal local oscillator waveform and having a sequence length corresponding to an oversampling rate of the sequence;
    a second mixer circuit configured to generate a second output signal from a second input signal, based on repeatedly clocking through a shifted sequence, which is the sequence as shifted by an integer number of sequence positions that is equal to one quarter of the sequence length for a first case where the sequence length divides by four, or is as close to one quarter of the sequence length as possible for a second case where the sequence length divides by two but not by four; and
    a control circuit configured to maintain a quadrature phase relationship between the first and second mixer circuits independent of whether the first or second case applies by controlling the second mixer circuit to clock coincident with the first mixer circuit if the first case applies, and to clock a half clock cycle out of phase with the first mixer circuit if the second case applies.

2. The mixer apparatus of claim 1, wherein the first and second mixer circuits are among respective groups of first and second mixer circuits arranged as respective pairs of first and second mixer circuits, and wherein the control circuit is configured to control the second mixer circuit in each pair to clock coincident with or a half clock cycle out of phase with the respective first mixer circuit in the pair, in dependence on the oversampling rate of the sequence used by the pair.

3. The mixer apparatus of claim 1, wherein the first mixer circuit is configured to generate the first output signal from the input signal by sequentially varying its input-to-output conductance in accordance with the sequence of the sample values, and wherein the second mixer circuit is configured to generate the second output signal from the second input signal by sequentially varying its input-to-output conductance in accordance with the shifted sequence of the sample values.

4. The mixer apparatus of claim 1, wherein the mixer apparatus is configured to apply a single-ended or differential clock signal to the first and second mixer circuits, said clock signal nominally having a fifty-percent duty cycle and a clock frequency equal to a desired frequency of the sinusoidal local oscillator waveform multiplied by the oversampling rate, and wherein the control circuit is configured to control whether the second mixer circuit clocks coincident with the first mixer circuit or clocks a half clock cycle out of phase with the first mixer circuit by controlling whether the second mixer circuit clocks on rising clock edges or on falling clock edges.

5. The mixer apparatus of claim 4, wherein control circuit is configured to assert a clocking control signal in dependence on whether the first or second case applies, and wherein the second mixer circuit includes a clock gating circuit that dynamically determines whether the second mixer circuit clocks on the rising or falling clock edges, in dependence on assertion of the clocking control signal.

6. The mixer apparatus of claim 1, wherein the control circuit is configured to select the sequence from a defined set of sequences corresponding to different oversampling rates, wherein all of the sequence lengths corresponding to the different oversampling rates are divisible by two and some of them are further divisible by four.

7. The mixer apparatus of claim 6, wherein the mixer apparatus includes a selection control input and wherein the control circuit is configured to select the sequence from the defined set in response to a selection control signal applied to the selection control input.

8. The mixer apparatus of claim 1, wherein the mixer apparatus comprises part of a transmitter circuit or a receiver circuit in a wireless communication apparatus that includes an oversampling control circuit configured to control the selection of the oversampling rate used by the mixer apparatus based on at least one of:
- a frequency relationship between transmit and receive frequencies of the wireless communication apparatus;
- a frequency relationship between one or more interferer signals and a receive frequency of the wireless communication apparatus; and
- a frequency relationship between a frequency of the first and second input signals and a clocking frequency of the first and second mixer circuits, which clocking frequency varies with the oversampling rate.

9. A wireless communication apparatus including a mixer apparatus in a receiver or transmitter circuit of the wireless communication apparatus, said mixer apparatus comprising:
- a first mixer circuit configured to generate a first output signal from an input signal, based on repeatedly clocking through a sequence of sample values representing one period of a sinusoidal local oscillator waveform and having a sequence length corresponding to an oversampling rate of the sequence;
- a second mixer circuit configured to generate a second output signal from a second input signal, based on repeatedly clocking through a shifted sequence, which is the sequence as shifted by an integer number of sequence positions that is equal to one quarter of the sequence length for a first case where the sequence length divides by four, or is as close to one quarter of the sequence length as possible for a second case where the sequence length divides by two but not by four; and
- a control circuit configured to maintain a quadrature phase relationship between the first and second mixer circuits independent of whether the first or second case applies by controlling the second mixer circuit to clock coincident with the first mixer circuit if the first case applies, and to clock a half clock cycle out of phase with the first mixer circuit if the second case applies.

10. A method of operating a mixer apparatus that comprises a first mixer circuit that generates a first output signal by mixing an input signal according to a sequence of sample values representing one period of a sinusoidal local oscillator waveform and having a sequence length corresponding to an oversampling rate of the sequence, and a second mixer circuit that generates a second output signal by mixing a second input signal according to a shifted sequence that the sequence as shifted by an integer number of sequence positions equal to one quarter of the sequence length for a first case where the sequence length divides by four, or is as close to one quarter of the sequence length as possible for a second case where the sequence length divides by two but not by four, said method comprising:
- determining whether the first or second case applies; and
- maintaining a quadrature phase relationship between the first and second mixer circuits independent of whether the first or second case applies by controlling the second mixer circuit to clock coincident with the first mixer circuit if the first case applies, and to clock a half clock cycle out of phase with the first mixer circuit if the second case applies.

11. The method of claim 10, wherein the first and second mixer circuits are among respective groups of first and second mixer circuits arranged as respective pairs of first and second mixer circuits, and wherein the method further comprises controlling the second mixer circuit in each pair to clock coincident with or a half clock cycle out of phase with the respective first mixer circuit in the pair, in dependence on the oversampling rate of the sequence used by the pair.

12. The method of claim 10, wherein the mixer apparatus is configured to apply a single-ended or differential clock signal to the first and second mixer circuits, said clock signal nominally having a fifty-percent duty cycle and a clock frequency equal to a desired frequency of the sinusoidal local oscillator waveform multiplied by the oversampling rate, and wherein controlling whether the second mixer circuit clocks coincident with the first mixer circuit or clocks a half clock cycle out of phase with the first mixer circuit comprises controlling whether the second mixer circuit clocks on rising clock edges or on falling clock edges.

13. The method of claim 12, wherein the second mixer circuit includes a clock gating circuit that dynamically determines whether the second mixer circuit clocks on the rising or falling clock edges, in dependence on assertion of a clocking control signal, and wherein controlling whether the second mixer circuit clocks on rising clock edges or on falling clock edges comprises asserting or not asserting the clocking control signal in dependence on whether the first or second case applies.

14. The method of claim 10, further comprising selecting the sequence from a defined set of sequences corresponding to different oversampling rates, wherein all of the sequence lengths corresponding to the different oversampling rates are divisible by two and some of them are further divisible by four.

15. The method of claim 14, wherein the mixer apparatus includes a selection control input and wherein selecting the sequence from the defined set comprises making the selection in response to a selection control signal applied to the selection control input.

16. The method of claim 10, wherein the mixer apparatus comprises part of a transmitter circuit or a receiver circuit in a wireless communication apparatus, and wherein the method includes selecting the oversampling rate of the sequence based on at least one of:
- a frequency relationship between transmit and receive frequencies of the wireless communication apparatus; and
- a frequency relationship between one or more interferer signals and a receive frequency of the wireless communication apparatus; and
- a frequency relationship between a frequency of the first and second input signals and a clocking frequency of the first and second mixer circuits, which clocking frequency varies with the oversampling rate.

* * * * *

UNITED STATES PATENT AND TRADEMARK OFFICE
CERTIFICATE OF CORRECTION

PATENT NO. : 8,639,206 B1  
APPLICATION NO. : 13/645974  
DATED : January 28, 2014  
INVENTOR(S) : Ek et al.

Page 1 of 1

It is certified that error appears in the above-identified patent and that said Letters Patent is hereby corrected as shown below:

On the Title Page, item (73) Assignee, please change "Stockholm" to --Stockholm (SE)--.

Signed and Sealed this  
Thirteenth Day of May, 2014

Michelle K. Lee  
*Deputy Director of the United States Patent and Trademark Office*